(12) United States Patent
Zavrel, Jr. et al.

(10) Patent No.: US 6,218,729 B1
(45) Date of Patent: *Apr. 17, 2001

(54) APPARATUS AND METHOD FOR AN INTEGRATED CIRCUIT HAVING HIGH Q REACTIVE COMPONENTS

(75) Inventors: Robert J. Zavrel, Jr.; Dan C. Baumann, both of Colorado Springs, CO (US)

(73) Assignee: Atmel Corporation, San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/267,889

(22) Filed: Mar. 11, 1999

(51) Int. Cl.[7] ............................ H01L 23/04; H01L 29/00; H01L 23/12; H01L 23/053
(52) U.S. Cl. ..................... 257/698; 257/531; 257/532; 257/700; 257/724
(58) Field of Search ........................... 257/531, 532, 257/535, 686, 698, 700, 723, 724, 777

(56) References Cited

U.S. PATENT DOCUMENTS

| | | | |
|---|---|---|---|
| 5,351,163 | 9/1994 | Dawson et al. | 361/321.1 |
| 5,475,264 | * 12/1995 | Sudo et al. | 257/723 |
| 5,488,542 | * 1/1996 | Ito | 361/793 |
| 5,497,337 | 3/1996 | Ponnapalli et al. | 364/489 |
| 5,532,906 | * 7/1996 | Hanari et al. | 361/749 |
| 5,635,761 | * 6/1997 | Cao et al. | 257/700 |
| 5,640,051 | * 6/1997 | Tomura et al. | 257/778 |
| 5,652,466 | * 7/1997 | Hirakawa et al. | 257/772 |
| 5,654,590 | * 8/1997 | Kuramochi | 257/778 |
| 5,661,341 | * 8/1997 | Neftin | 257/698 |
| 5,726,485 | * 3/1998 | Grass | 257/532 |
| 5,805,043 | 9/1998 | Bahl | 336/200 |
| 5,811,868 | 9/1998 | Bertin et al. | 257/516 |
| 5,811,880 | 9/1998 | Banerjee et al. | 257/724 |
| 5,839,184 | 11/1998 | Ho et al. | 29/605 |
| 5,861,647 | 1/1999 | Zhao et al. | 257/296 |

* cited by examiner

Primary Examiner—Ngan V. Ngo
(74) Attorney, Agent, or Firm—Thomas Schneck; John P. McGuire, Jr.

(57) ABSTRACT

In an IC packaging scheme, a multilayer substrate is composed of electrically conductive layers of interconnects, separated by insulative layers of epoxy resin or ceramic and connected by vias. Passive elements are integrated within the substrate at the definition stage during layout of the interconnects. The passives can be used to enhance the electrical performance of the active circuit die to a maximum extent allowed by the material technology used for the substrate. Material selection for the package is made to allow for the best passive integration for a given circuit design. Typical applications include power supply bypass capacitors, radio frequency tuning, and impedance matching. The incorporation of passives in the packaging substrate creates a new class of electrically tailorable packaging that can derive improved performance for any given die design over existing approaches.

13 Claims, 7 Drawing Sheets

APPARATUS AND METHOD FOR AN INTEGRATED CIRCUIT HAVING HIGH Q REACTIVE COMPONENTS

TECHNICAL FIELD OF THE INVENTION

The invention relates generally to semiconductor device packages and more specifically to fabricating high Q reactive components in such packages.

BACKGROUND ART

The present invention relates to the construction of high Q passive devices, typically used for example in radio frequency applications. Such devices are notoriously difficult to incorporate in the semiconductor die because of various factors: The quality factor (Q) of both lumped and distributed reactive components is primarily determined by the resistance of the metal, dielectric losses and parasitic reactances. The actual inductive and capacitive values in lumped components is greatly limited by the available area on the semiconductor die. Similarly, distributed transmission line resonators are difficult to configure on a semiconductor die for desired frequencies also because of space limitations. The usual practice is to place the lumped reactances on the PC board. However, the parasitic reactances associated with conventional package technologies often seriously degrade the performance of a functional circuit. For example, in power amplifier applications, the parasitic reactance of the package leads often approaches or exceeds the output impedance of the active semiconductor device. In many cases, the package reactance negates the possibility of building acceptable power amplifiers on silicon or silicon-germanium processes. Similar arguments can be cited for small signal applications as well.

Integrated circuits are typically mounted in plastic or ceramic packages that connect the semiconductor die to leads or balls which are subsequently soldered to a PCB. Some package types contain multiple metal layers, e.g. a flip-chip ball-grid array, in order to route the I/O pads and utility pads to the external contacts of the package.

FIG. 11, for example, shows a typical ball-grid package. A semiconductor die 1102 is mounted to a substrate 1112 is secured thereto by an underfill epoxy compound 1106. The substrate includes a set of metal interconnect layers to provide an electrical pathway between the solder balls (or "bumps") 1104 of the die and the solder balls 1114 of the substrate. An overmold epoxy 1110 is used to encapsulate the die, thus completing the ball-grid package. FIG. 12 is an enlarged view of a portion of substrate 1112, identified in FIG. 11. It can be seen that the substrate consists of a laminated structure of alternating layers of metal 1212. These metal layers are insulated from each other by layers of insulating material 1210 such as epoxy or ceramic. These metal layers provide interconnections among or between the bonding pads or "bumps" on the semiconductor die 1102. The metal layers are patterned with interconnects (not shown) and vias 1202 which provide interconnectivity among the metal layers.

What is needed is a scheme for providing high Q components in IC devices without having to use discrete components. It is desirable to incorporate such devices within the IC device itself, and thus save space on the PCB while at the same time gaining the advantages made possible by the use of high Q components.

SUMMARY OF THE INVENTION

In accordance with the invention, an improved IC packaging scheme includes incorporation of passive devices in the packaging of the IC. An IC mounting substrate carries the semiconductor die and has a laminated structure of metal interconnects for providing external contacts to the I/O pads of the die and utility pads such as power and ground. Designed into the metal interconnect layers, are passive devices which connect with the traces comprising the interconnects, directly or by way of vias, to provide additional electrical functionality to the semiconductor die. Therefore desired reactive components are fabricated from the package metal layers proper. Resistance is greatly reduced since the package metal is typically 20 microns thick compared to on-chip metal which is typically less than one micron thick. Typical applications include, but are not limited to filter circuits for filtering input or output signals, power supply bypass capacitors, impedance matching circuits, resonators, and so on. The invention is also applicable in multi-chip modules where two or more semiconductor dice are packaged in a single IC package. Passives could be used to couple signals going between the dice.

A method of fabricating the substrate of the present invention includes depositing insulative layers and metal layers. Each metal layer is patterned and treated to a photoresist etch step. The patterning includes defining the traces which constitute the interconnects. The structures which constitute the passives are patterned at the same time as the interconnects. No additional metal is consumed, since the structures for the passives are patterned from the same metal layer as for the interconnects; the only difference is that less metal is etched away.

BEST MODE FOR CARRYING OUT THE INVENTION

Figure 1:
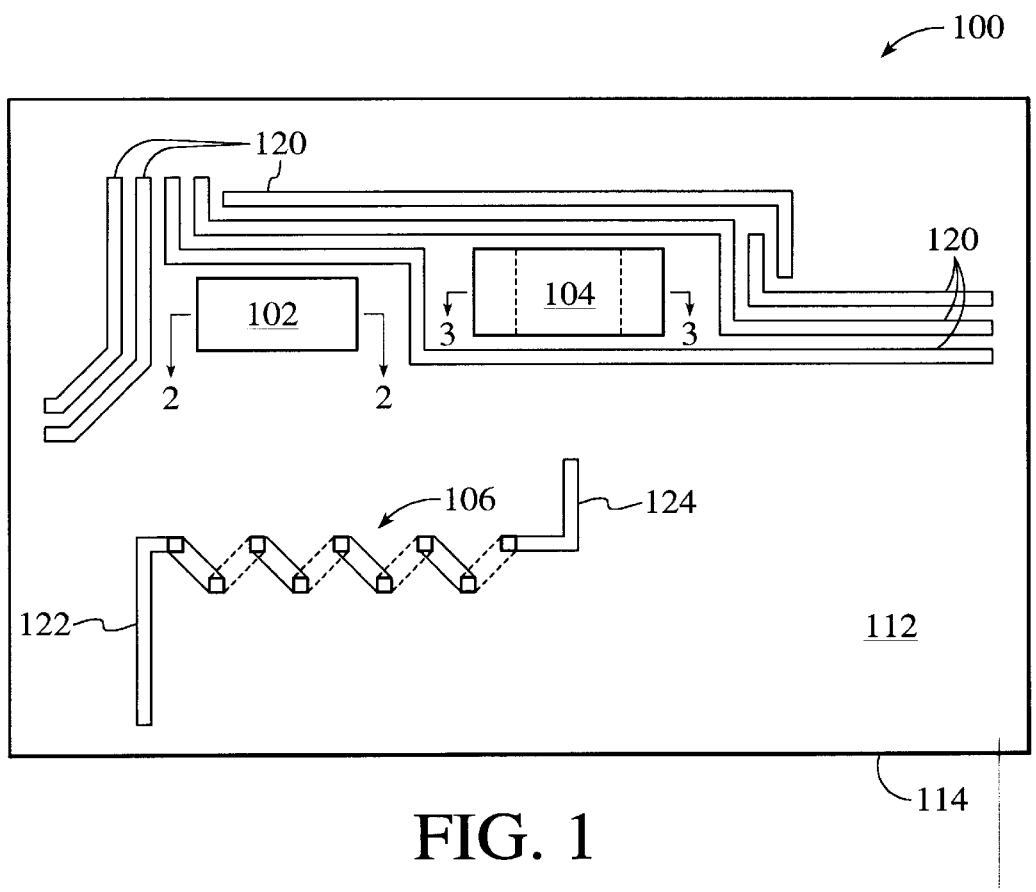
FIG. 1 is a top view of an IC substrate showing an arrangement of interconnects and passive devices in accordance with the invention.
Figure 11:
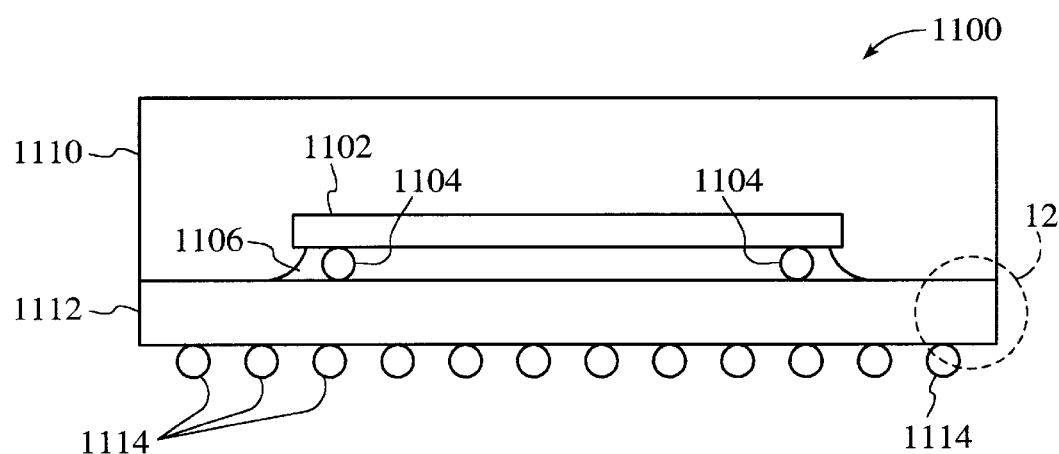
FIGS. 11 and 12 show a typical prior art IC packaging scheme.
Figure 12:
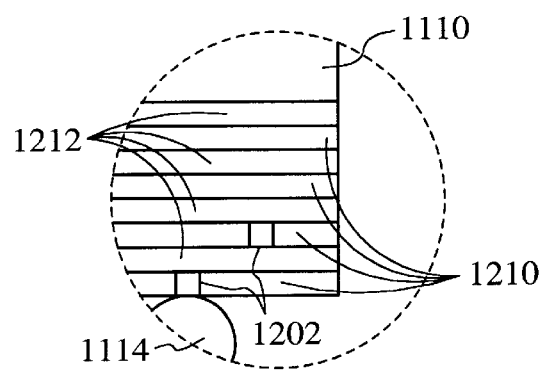

FIG. 11 shows the typical ball-grid IC package, comprising die 1102 mounted to substrate 1112 and enclosed by encapsulant 1110. Turning to FIG. 1, a laminated substrate 114 in accordance with the preferred mode of the invention includes one or more metal layers of interconnect, each separated by a layer of insulative material. FIG. 1 shows an uppermost layer of interconnect comprising a plurality of interconnect traces 120 and passive components 102–106. More particularly, components 102 and 104 are capacitors and component 106 is an inductor. It can be seen that inductor 106 includes traces 122 and 124. This layer of interconnects is disposed on the top surface 112 of substrate 114.

Figure 2:
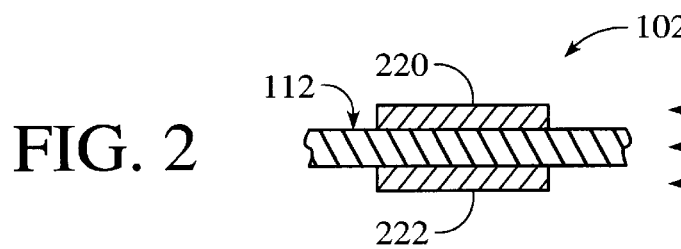
FIGS. 2 and 3 are side views of two capacitor devices.

Referring to FIG. 2, the side view of capacitor 102 of FIG. 1 taken along view line 2—2 shows a portion of substrate 114. There is a metal layer 200 disposed atop an insulative layer 202, which in turn is disposed atop another metal layer 204. Capacitor 102 is shown consisting of two metal plates 220 and 222. Each plate is formed in a separate metal layer 200 and 204 and separated by insulative layer 202. The insulative layer thus acts as a dielectric. Typical insulative materials include an epoxy resin or can be a ceramic material. There is no one preferred material, as the choice will depend on such factors as desired electrical characteristics, desired physical characteristics, manufacturing cost and so on. The particular application of an IC device of the present invention will dictate the particular materials used.

Figure 3:
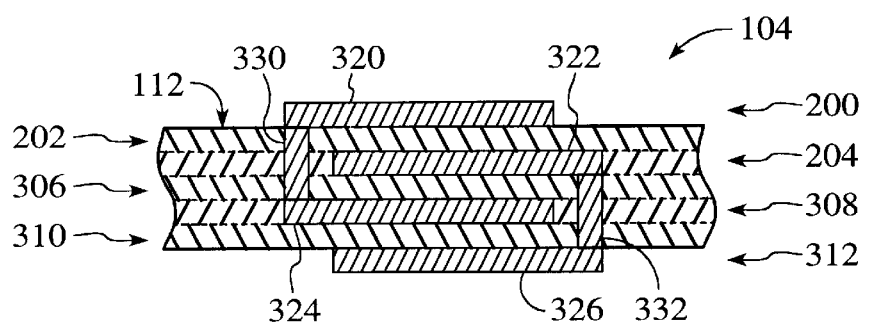

Referring to FIG. 3, the side view of capacitor 104 of FIG. 1 taken along view line 3—3 shows additional metal and insulative layers 306–312 of substrate 114. Capacitor 104 is a multi-layered plate capacitor. In this example, the structure of the capacitor spans four layers of metal interconnect 200, 204, 308 and 312. Four plates 320, 322, 324 and 326 are respectively formed in metal layers 200, 204, 308 and 312. The plates are vertically aligned in an overlapping manner. The insulating layers form the dielectric of the capacitor. A via 330 couples together plates 320 and 324, while another via 332 couples together plates 322 and 326. The insulative material of layers 202, 306 and 310 serve as the dielectric material of capacitor 104.

It should be noted that capacitors 102 and 104 can be coupled to the pads of the die (e.g. die 902, FIG. 9) as devices in the circuitry of the die, or between a pad of the die and one of the external pins (solder balls) of the IC package. Such connections can be accomplished by the use of vias in the situation where it is desired to provide connectivity to an interconnect in an underlying metal layer. It is also noted that the capacitors can be disposed within the interior metal layers of substrate 114. For example, the plate capacitor shown in FIG. 2 can be formed in metal layers 204 and 308 of FIG. 3. In fact, as will be made clear, any passive device can be disposed in any of the metal layers of the substrate. Finally, the connections to the plates of the capacitor can be made in any of a number of ways. Interconnect traces can be patterned to emanate directly from the plates and vias can be used to couple to interconnects in other metal layers. The specific connective structure will depend on how and to what the passive device is coupled.

Figure 4A:
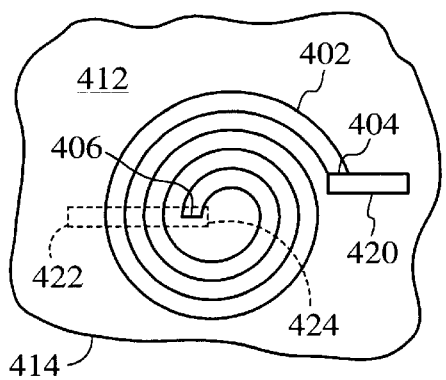
FIGS. 4A and 4B are top and side views respectively of a spiral inductor.
Figure 4B:
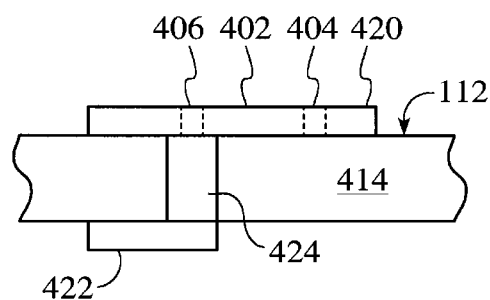

Turn now to FIGS. 4A and 4B, which show an example of a spiral inductor 402 disposed upon the surface 412 of an insulation layer 414. The outer end of the spiral is connected to an interconnect trace 420. The inner end of the spiral is coupled to a trace 422 formed in an underlying metal layer and coupled thereto by a via 424. While an air bridge can be used to provide connectivity to the inner end of the spiral, such a structure is generally more difficult to fabricate and so the embodiment shown in FIGS. 4A and 4B is preferred. The interconnect traces 420 and 422 can be on opposite metal layers as shown in the figures, or they can be on the same metal layer as the spiral, or they can be disposed in some other metal layer, depending on how the device is to be connected.

Figure 5A:
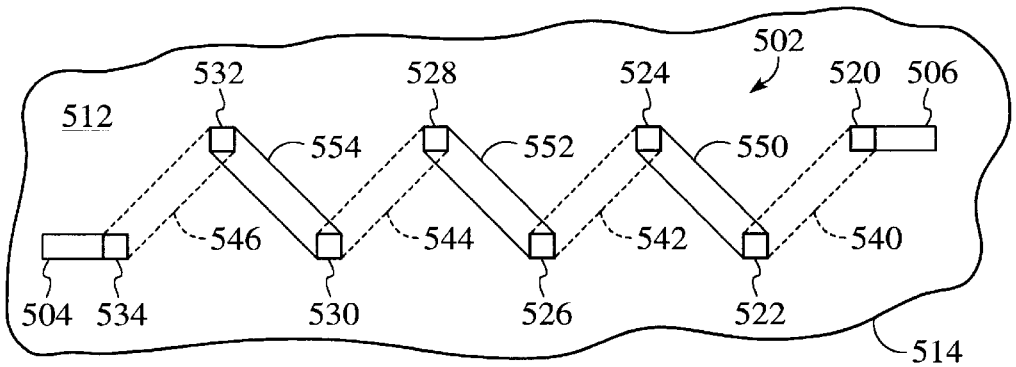
FIGS. 5A–5C are views of a helical inductor, showing respectively a top view, a head-on view and a side view.
Figure 5B:
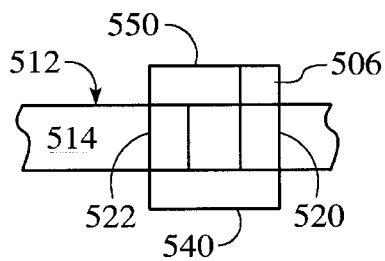
Figure 5C:
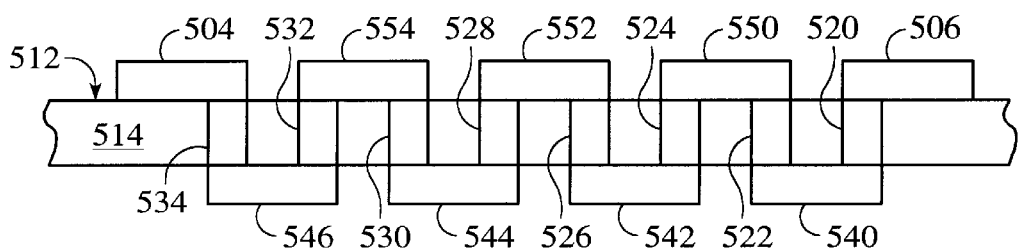

Referring to FIGS. 5A–5C, an example of a helical inductor 502 is shown. This device consists of a first plurality of metal segments 550, 552 and 554 disposed in a first metal layer and arranged parallel to each other along a diagonal. A second plurality of metal segments 540, 542, 544 and 546 are disposed in a second metal layer and arranged parallel to each other in a diagonal direction opposite that of the first metal segments. A set of vias 522–532 connect the first segments to the second segments in end-to-end fashion. The result is a zig-zag configuration viewed from the top as shown in FIG. 5A, giving the appearance of a helical structure albeit a square helical structure. The end segments 540 and 546 are coupled to interconnect traces 506 and 504 by way of vias 520 and 534. Alternatively, traces 506 and 504 could be formed in the same metal layer as end segments 540 and 546, which would obviate the need for the vias. The particular structure used will depend on where the connections to the passive device will be made.

Figure 6:
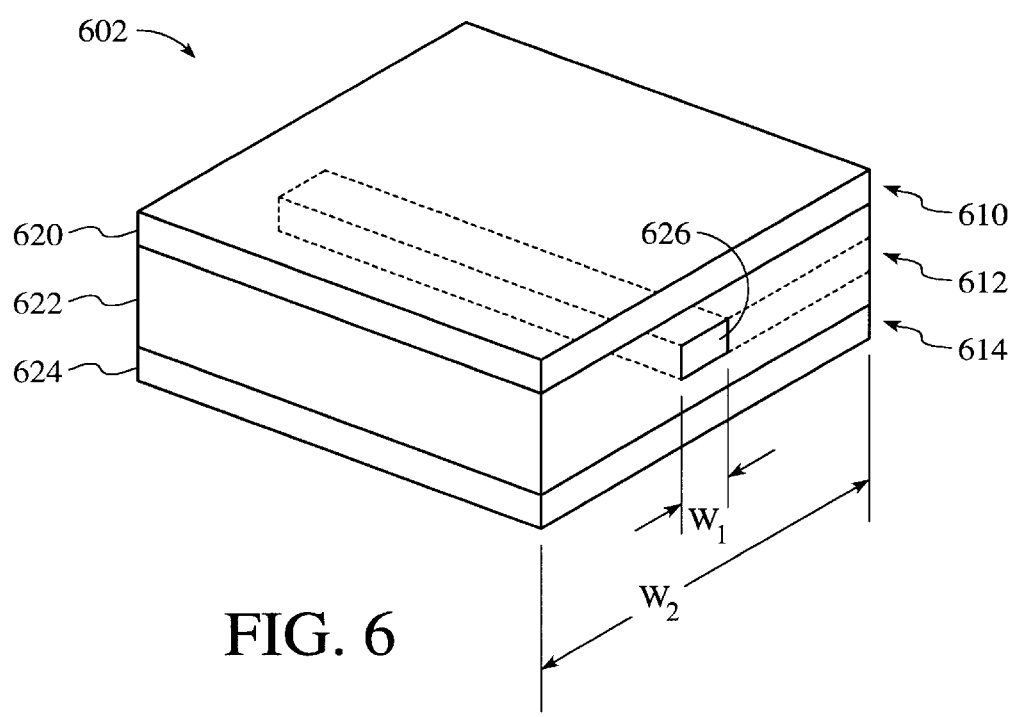
FIG. 6 is a perspective view of a resonator.

Turning to FIG. 6, the perspective view of a transmission line resonator 602 shows a first plate 620 disposed in a first metal layer 610 and a second plate 624 disposed in a second metal layer 614. The metal layers are separated by insulative material 622. Sandwiched between the two plates is a metal strip 626 disposed in yet a third metal layer 612. The width $w_2$ of the plates is greater than the width $w_1$ of the metal strip. Alternatively, the resonator can be constructed with only one of the two plates 620 and 624.

Figure 7A:
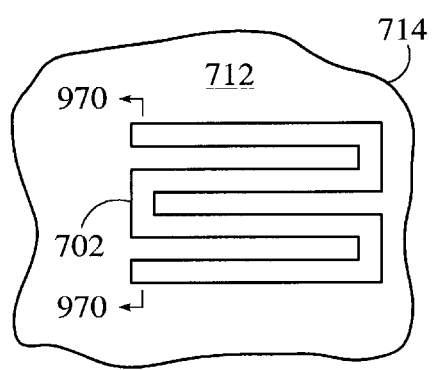
FIGS. 7A and 7B are top and side views of a resistor.
Figure 7B:
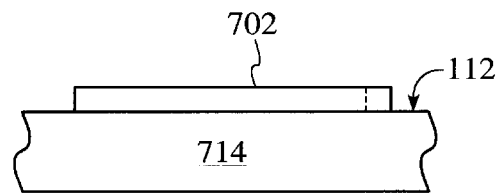

As a final example of passive devices made in accordance with the present invention, FIGS. 7A and 7B show a resistor 702 disposed in a metal layer on the surface 712 of insulative layer 714. It should be clear from the foregoing examples that other passive devices can be incorporated into a laminated substrate for IC packages in very much the same manner as shown above. An advantage of the invention is that the interconnect layers of the packaging substrate generally are not as dense as in the semiconductor die itself. It is therefore possible to construct lower valued resistors since there is more room to etch wider traces and the package metal interconnects are thicker than on-die metal traces. Similarly, the resistances of the inductors' and capacitors' metal can be lowered by this invention and thus higher Q devices can be realized.

Figure 8:
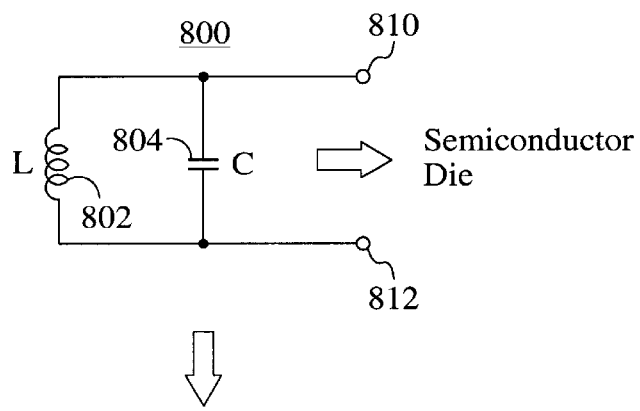
FIGS. 8 and 9 are cross-sectional views of two typical circuits formed in an IC substrate.
Figure 8:
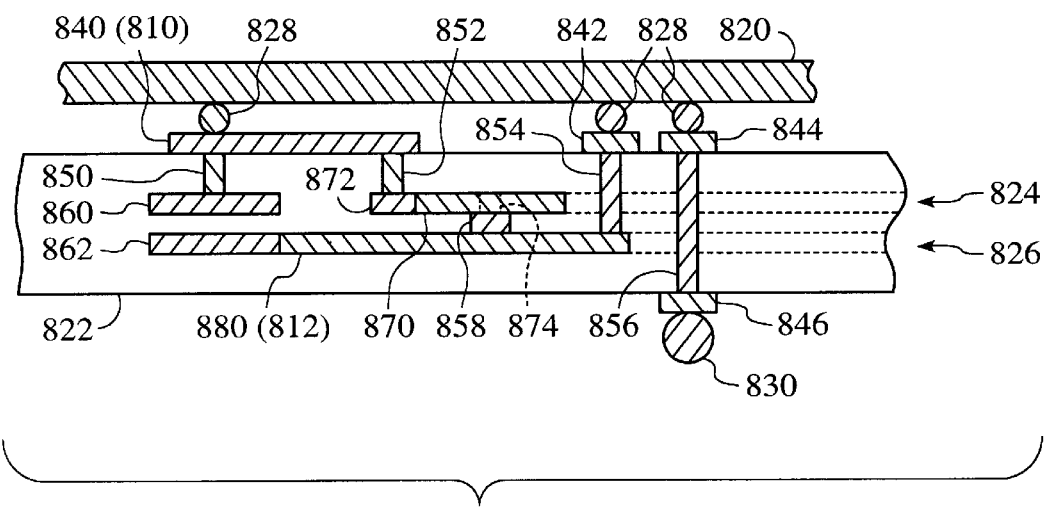

The discussion will now turn to typical circuits that might be incorporated into the substrate of an IC package. FIG. 8 shows a tank circuit 800 used as a resonator for oscillators such as VCO's (voltage controller oscillators), comprising a parallel combination of an inductor 802 and a capacitor 804. The tank circuit typically will be coupled to circuitry on the semiconductor die by way of terminals 810 and 812 to complete the oscillator circuit.

The cross-sectional view in FIG. 8 shows a semiconductor die 820 mounted to a laminated substrate 822. Solder bumps 828 of the die are coupled to interconnects 840–810 formed atop substrate 822. Vias 850–854 provide an electrical path to the underlying metal layers 824 and 826. Capacitor 804 is defined by plates 860 and 862 respectively disposed in metal layers 824 and 826. Inductor 802 is defined by a spiral structure 870 which is disposed in metal layer 824, greater detail for which is given in FIGS. 4A and 4B. Via 850 couples one plate of capacitor 804 to interconnect trace 840, while via 852 couples the outer end 872 of spiral structure 870 to trace 840. As can be seen, trace 840 corresponds terminal 810 of the circuit.

Continuing, the cross-sectional view further shows an interconnect trace 880 running from plate 862 of the capacitor to a via 858 which connects to the inner end 874 of spiral structure 870 in the metal layer above. Via 854 couples trace 880 to pad 842. Trace 880 therefore corresponds to terminal 812 of the circuit. Completing the discussion of FIG. 8, it can. be seen that die 820 has a direct connection to an externally accessible solder ball 830 by way of pad 844, via 856 and pad 846, illustrating how the semiconductor die can receive or send external signals.

Figure 9:
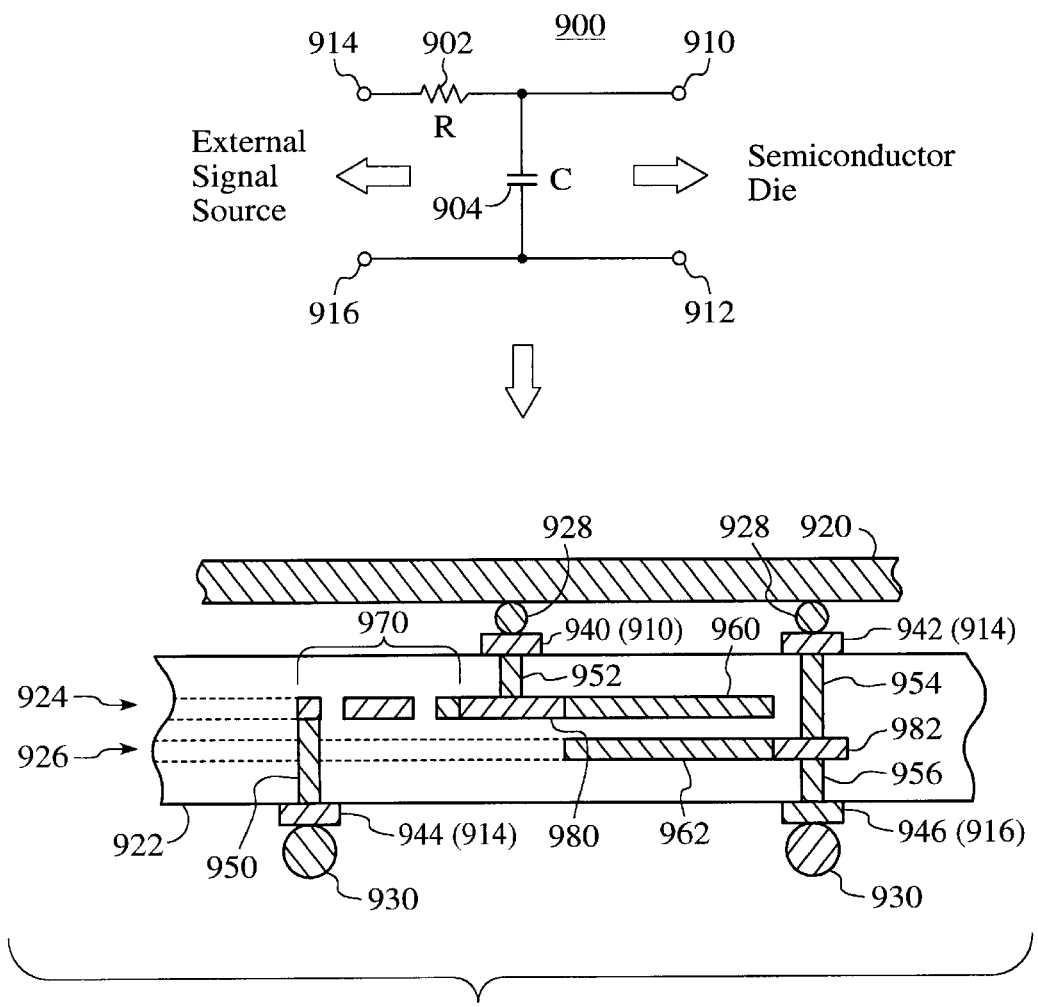

Turn now to FIG. 9 for another circuit example. The circuit shown is a low pass filter 900, comprising resistor 902 and capacitor 904. Terminals 914 and 916 receive an external signal, while terminals 910 and 912 are coupled to circuitry on the semiconductor die. The cross-sectional view shows semiconductor die 920 mounted to a laminated substrate 922. A resistor 970 is disposed in metal layer 924. The cross-sectional view of the resistor is taken from view line 970—970 shown in FIG. 7A. One end of resistor 970 is coupled to a trace 980, which in turn is coupled to one plate 960 of capacitor 904. The other plate 962 of the capacitor is disposed in metal layer 926.

A via 952 extends through the insulative material of substrate 922 and contacts pad 940 to which solder bump 928 of the semiconductor die is coupled. It can be seen that pad 940 corresponds to terminal 910 of the circuit. A trace 982 is coupled to plate 962 of capacitor 904. Vias 954 and 956 connect to pads 942 and 946 respectively. As can be seen, pads 942 and 946 correspond to terminals 914 and 916 respectively. Finally, via 950 provides an electrical pathway from pad 944 (which corresponds to terminal 914) to the other end of resistor 970.

These exemplary circuits illustrate the variety of passive circuitry that can be implemented in accordance with the present invention. There are several important advantages to the construction of such passives as disclosed in the foregoing. The reactive values (C or L) and the resonant frequency of resonators made in this manner can be designed to have much larger values than is commonly available if constructed on the semiconductor die proper. The substrate of the IC package typically has a larger area than the die itself, thus allowing for larger physical dimensions and correspondingly larger capacitor and inductor values. In the case of capacitors, the presence of the multiple metal layers makes possible the fabrication of multiplate capacitors. The Q values of the capacitors, inductors and resonators can be made higher because of the characteristics of ceramic or epoxy as compared with a semiconductor material, as well as larger metal conductors. No additional metal is consumed, since the structures for the passives are patterned from the same metal layer as for the interconnects; the only difference is that less metal is etched away. Since the metal is "free" in the package, the cost of these devices is very low. The incorporation of passives in the packaging substrate in the manner disclosed creates a new class of electrically tailorable IC packaging that can derive improved performance for any given die design over existing approaches.

Other typical circuits include, but are not limited to: power supply bypass capacitors wherein multiple by-pass leads from the semiconductor substrate to the by-pass capacitor permit the use of high resistivity material to be used in the substrate, resulting in higher on-die substrate isolation. Two or more inductors can be configured on adjacent metal layers separated by an insulative layer to provide mutual coupling and thus form a transformer. Resonators can be constructed using shortened transmission lines (particularly useful when using a high dielectric insulating material such as ceramic). This type of resonator can be used for band-pass filters, band-reject filters, resonators for VCOs or free-running oscillators, and radio frequency functional tuning. In multi-chip module (MCM) applications, coupling circuitry can be implemented to couple together the multiple semiconductor dice mounted on the substrate.

Figure 10:
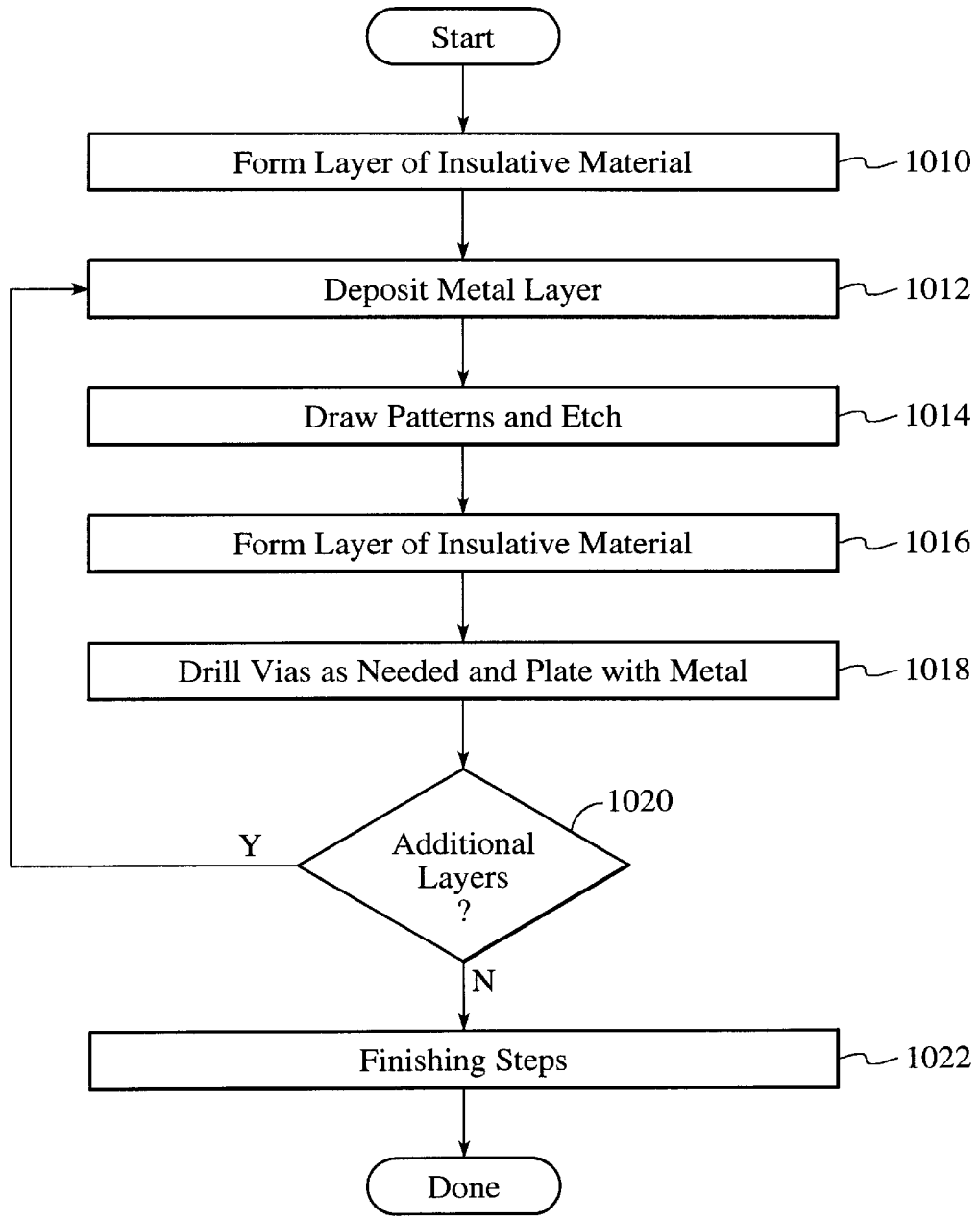
FIG. 10 is a flow chart of the process steps of the invention.

Turn now to FIG. 10 for a discussion of the processing steps by which the passives can be incorporated into the substrate of an IC package. As can be seen, the same steps are used for making passives as for forming multiple interconnect layers. First, a layer of insulative material is formed, step 1010. At this point vias may be formed through the insulative layer and filled to provide a conductive path through to the bottom exterior surface of the insulative layer so that electrical connections can be made to the semiconductor die. Next, a layer of conductive material (typically copper, gold, tungsten and related alloys are used) is deposited over the insulative layer, step 1012. One or more patterns are then drawn to define the interconnects for the metal layer, step 1014. At the same time additional patterns may be drawn to define the structures of passive devices that are to disposed in the metal layer. The pattern is then subjected to an etch and photoresist process to remove the unwanted metal, leaving the desired patterns. In step 1016, the next insulative layer is formed atop the metal layer. In order to provide connectivity to the underlying metal layer, vias must be drilled in the insulative layer and filled with metal, step 1018. At step 1020, if additional layers are needed then the foregoing steps are repeated until a laminated substrate is produced. Finishing steps include mounting and securing a semiconductor die to the substrate, and in the case of BGA attachment of solder balls to the multilayer substrate encapsulation of the die. The foregoing processing steps are well known in the IC packaging arts. Any of a number of techniques are available to practice the present invention. The selection of any given technique will depend on factors such as materials used, desired operating conditions, packaging requirements, production costs, and so on.

What is claimed is:

1. An integrated circuit comprising:
   a semiconductor die having a first circuit disposed therein;
   a substrate upon which said die is mounted, said substrate including alternating layers of metal interconnects and insulative material, said die having electrical connections to one or more layers of metal interconnects;
   a tank circuit including an inductor and a capacitor fully constructed from one or more layers of metal interconnects within said substrate, said tank circuit being in electrical communication with said first circuit of said die and having a pair of terminals coupled to said semiconductor die; and
   an encapsulation disposed about said die and atop said substrate, thereby providing a protective encasing for said die;
   said substrate further including external electrical contacts, said electrical contacts being in electrical contact with some of said metal interconnects.

2. A method of fabricating an integrated circuit comprising the steps of:
   (a) fabricating circuitry on a semiconductor die, including forming a plurality of pads for transmitting and receiving signals and for providing one or more voltage potentials;
   (b) fabricating a substrate of insulative material, including forming at least one layer of conductive interconnects in said substrate and forming at least one capacitor fully within said substrate from said at least one layer of conductive interconnects;
   (c) mounting and securing said semiconductor die upon said substrate;
   (d) making electrical connections between said semiconductor die and said at least one layer of conductive interconnects; and
   (e) making electrical connections between said semiconductor die and said at least one capacitor.

3. A semiconductor device comprising:
   at least one semiconductor die having circuitry formed thereon;

a laminated substrate having a surface upon which said die is mounted, said substrate having one or more metal layers and one or more insulative layers, said die being electrically coupled to some of said metal layers, said metal layers including a plurality of interconnects and a plurality of vias for electrically coupling said interconnects to other said interconnects and to said semiconductor die; and a capacitor fully constructed from said interconnects within said substrate and being in electrical communication with said semiconductor die, said capacitor having a first plate disposed in a first one of said one or more metal layers and a second plate disposed in a second one of said one or more metal layers, said first and second plates being separated by one of said one or more insulative layers.

4. A semiconductor device comprising:

at least one semiconductor die having circuitry formed thereon;

a laminated substrate having a surface on which said die is mounted, said substrate having one or more metal layers and one or more insulative layers, said die being electrically coupled to some of said metal layers, said metal layers including a plurality of interconnects and a plurality of vias for electrically coupling said interconnects to other said interconnects and to said semiconductor die; and an inductor fully constructed from said interconnects within said substrate and being in electrical communication with said semiconductor die, said inductor being a metallic spiral structure disposed in one of said one or more metal layers.

5. A semiconductor device comprising:

at least one semiconductor die having circuitry formed thereon;

a laminated substrate having a surface upon which said die is mounted, said substrate having one or more metal layers and one or more insulative layers, said die being electrically coupled to some of said metal layers, said metal layers including a plurality of interconnects and a plurality to vias for electrically coupling said interconnects to other said interconnects and to said semiconductor die; and a resonator fully constructed from said interconnects within said substrate and being in electrical communication with said semiconductor die, said resonator having a first plate disposed in a first one of said one or more metal layers and a metal strip disposed inn a second one of said one or more metal layers; said first plate having a width dimension greater than a width dimension of said metal strip.

6. A semiconductor device comprising:

at least one semiconductor die having circuitry formed thereon;

a laminated substrate having a surface upon which said die is mounted, said substrate having one or more metal layers and one or more insulative layers, said die being electrically coupled to some of said metal layers, said metal layers including a plurality of interconnects all fabricated from the same metal and a plurality of vias for electrically coupling said interconnects to other said interconnects and to said semiconductor die; and a transformer fully constructed from said interconnects within said substrate and being in electrical communication with said semiconductor die, said transformer being formed by two or more inductors configured on adjacent ones of said metal layers with one of said insulative layers between said metal layers.

7. A method of fabricating an integrated circuit comprising the steps of:

(a) fabricating circuitry on a semiconductor die, including forming a plurality of pads for transmitting and receiving signals and for providing one or more voltage potentials;

(b) fabricating a substrate of insulative material, including forming at least one layer of conductive interconnects in said substrate and forming at least one inductor fully within said substrate from said at least one layer of conductive interconnects;

(c) mounting and securing said semiconductor die upon said substrate;

(d) making electrical connections between said semiconductor die and said at least one layer of conductive interconnects; and (e) making electrical connections between said semiconductor die and said at least inductor.

8. A method of fabricating an integrated circuit comprising the steps of:

(a) fabricating circuitry on a semiconductor die, including forming a plurality of pads for transmitting and receiving signals and for providing one or more voltage potentials;

(b) fabricating a substrate of insulative material, including forming at least one layer of conductive interconnects in said substrate and forming at least one resonator fully within said substrate from said at least one layer of conductive interconnects;

(c) mounting and securing said semiconductor die upon said substrate;

(d) making electrical connections between said semiconductor die and said at least one layer of conductive interconnects; and (e) making electrical connections between said semiconductor die and said at least one resonator.

9. The semiconductor device of claim 3 wherein said one or more insulative layers is an epoxy resin material.

10. The semiconductor device of claim 3 wherein said one or more insulative layers is a ceramic material.

11. The semiconductor device of claim 3 wherein said passive device is a capacitor, said capacitor comprising a plurality of plates, each of said plates disposed in a separate one of said one or more metal layers, said plates being vertically aligned in an overlapping manner, odd numbered ones of said plates being electrically coupled together, even numbered ones of said plates being electrically coupled together.

12. The semiconductor device of claim 4 wherein said passive device is an inductor; said inductor comprising a first plurality of segments disposed in a first one of said one or more metal layers and a second plurality of segments disposed in a second one of said one or more metal layers; said first and second ones of said one or more metal layers being separated by one of said one or more insulative layers; said inductor further comprising a plurality of metal-filled vias electrically coupling said first segments to said second segments.

13. The semiconductor device of claim 7 wherein said resonator includes a second plate disposed in a third one of said one or more metal layers.

* * * * *